United States Patent
Lee et al.

(10) Patent No.: US 9,865,624 B2
(45) Date of Patent: Jan. 9, 2018

(54) LIQUID CRYSTAL DISPLAY

(71) Applicant: Samsung Display Co., LTD., Yongin-si, Gyeonggi-Do (KR)

(72) Inventors: Hongbeom Lee, Yongin-si (KR); Kyounghae Min, Yongin-si (KR); Hoyong Shin, Yongin-si (KR); Jihoon Shin, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/057,719

(22) Filed: Mar. 1, 2016

(65) Prior Publication Data
US 2016/0342008 A1    Nov. 24, 2016

(30) Foreign Application Priority Data

May 21, 2015  (KR) .................. 10-2015-0071139

(51) Int. Cl.
*H01L 27/12* (2006.01)
*G02F 1/1362* (2006.01)
*G02F 1/1343* (2006.01)

(52) U.S. Cl.
CPC ........ *H01L 27/124* (2013.01); *G02F 1/13624* (2013.01); *G02F 1/136286* (2013.01); *G02F 2001/134345* (2013.01)

(58) Field of Classification Search
CPC .............. H01L 27/124; G02F 1/13624; G02F 2001/134345; G02F 2001/136218; G02F 1/136286–2001/136295
See application file for complete search history.

(56) References Cited

U.S. PATENT DOCUMENTS

| | | | |
|---|---|---|---|
| 5,877,737 A | 3/1999 | Kim et al. | |
| 2004/0196427 A1* | 10/2004 | Um | G02F 1/133371 349/143 |
| 2006/0023151 A1* | 2/2006 | Lee | G02F 1/133707 349/141 |
| 2009/0073138 A1* | 3/2009 | Lee | G06F 3/0412 345/173 |
| 2012/0105777 A1* | 5/2012 | Lee | H01L 27/124 349/106 |
| 2013/0242239 A1 | 9/2013 | Chang et al. | |
| 2013/0342777 A1 | 12/2013 | Jeong et al. | |
| 2014/0218655 A1 | 8/2014 | Jeong et al. | |

FOREIGN PATENT DOCUMENTS

| | | |
|---|---|---|
| KR | 19970012279 A | 3/1997 |
| KR | 1020130104521 A | 9/2013 |
| KR | 1020140000459 A | 1/2014 |
| KR | 1020140100126 A | 8/2014 |

* cited by examiner

*Primary Examiner* — Cuong B Nguyen
*Assistant Examiner* — Juanita Rhodes
(74) *Attorney, Agent, or Firm* — Cantor Colburn LLP

(57) ABSTRACT

A liquid crystal display includes a gate line and a data line disposed on a substrate, a reference voltage line aligned with the data line, and a plurality of pixels arranged substantially in a matrix form. In such a liquid crystal display, each pixel includes a first sub-pixel, a second sub-pixel, and a driving unit electrically connected to the gate line, the data line and the reference voltage line. In such a liquid crystal display, one reference voltage line is disposed between two adjacent pixels.

18 Claims, 9 Drawing Sheets

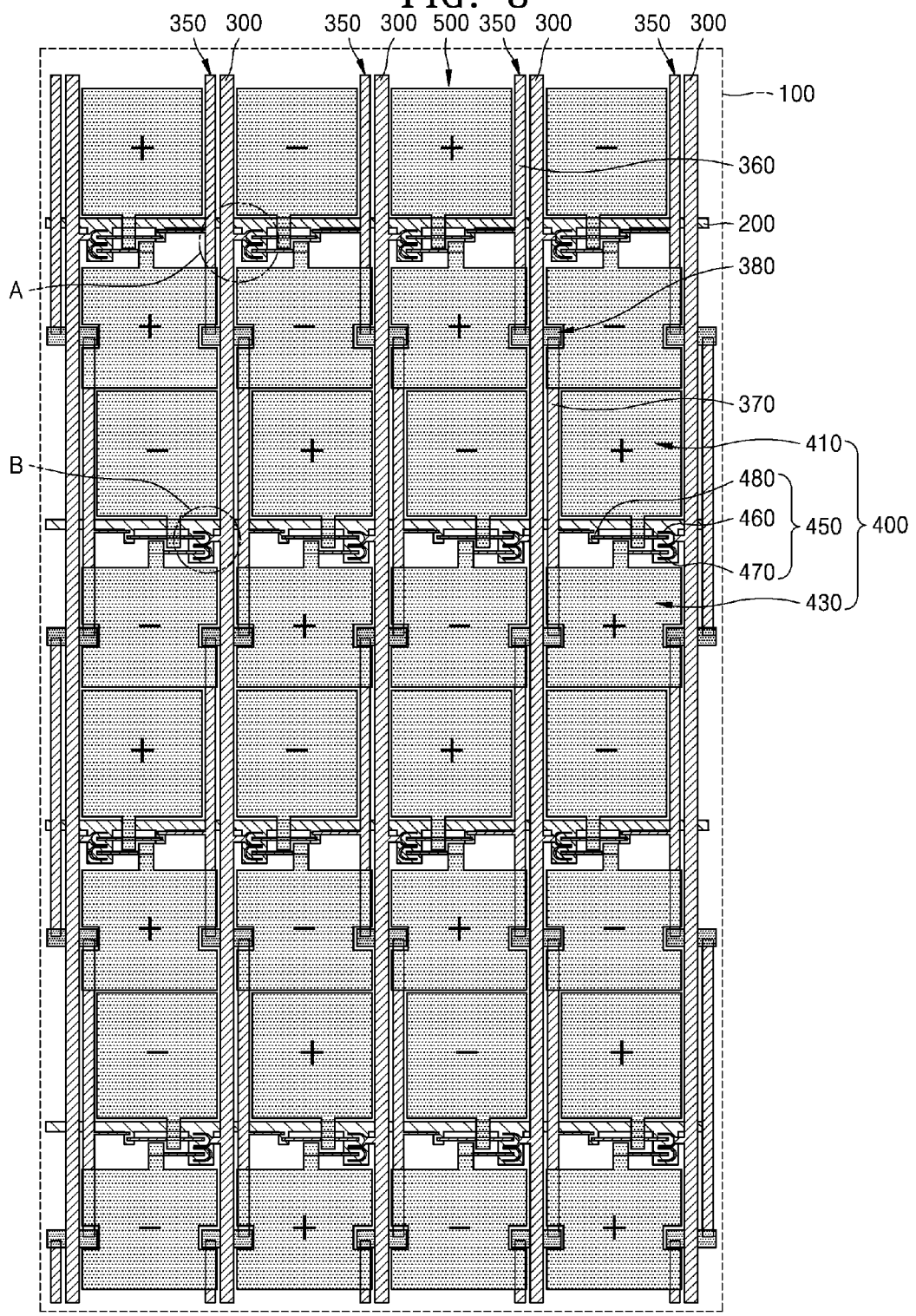

LIQUID CRYSTAL DISPLAY

This application claims priority to Korean Patent Application No. 10-2015-0071139, filed on May 21, 2015, and all the benefits accruing therefrom under 35 U.S.C. §119, the content of which in its entirety is herein incorporated by reference.

BACKGROUND

1. Field

One or more exemplary embodiments relate to a liquid crystal display, and more particularly, to a liquid crystal display having two sub-pixels in one pixel.

2. Description of the Related Art

A liquid crystal display is one of the most widely used types of flat panel display device. The liquid crystal display typically includes two panels on which a pixel electrode, a common electrode, etc. are provided, and a liquid crystal layer disposed between the two panels, where an electric field is generated in the liquid crystal layer by applying a voltage to the pixel electrode or the common electrode. In such a liquid crystal display, the arrangement of liquid crystal molecules of the liquid crystal layer changes based on the electric filed generated in the liquid crystal layer, to display an image by controlling polarization of light passing through the liquid crystal layer.

A liquid crystal display may be a type of liquid crystal display in which one pixel is divided into two sub-pixels and a voltage of any one of the two sub-pixels is lowered to make voltages of the sub-pixels different from each other so that the sub-pixels have different transmittance from each other. In such a way, the visibility is improved, and thus, a side visibility may become substantially close to a front visibility.

SUMMARY

In a liquid crystal display, as described above, when the voltage of any one of the two sub-pixels of one pixel is lowered to make the voltages of the two sub-pixels different from each other in a low gray scale, the brightness of a side surface is increased, compared to that of a front surface, and thus, it may be difficult to accurately represent a gray scale in a low gray scale area. Also, overall brightness may be lowered, compared to an applied pixel voltage so that driving efficiency may be reduced.

One or more exemplary embodiments relate to a liquid crystal display in which a side visibility becomes substantially close to a front visibility, a gray scale in a low gray scale area is accurately represented and brightness is effectively prevented from being lowered, relative to an applied pixel driving voltage.

According to one or more exemplary embodiments, a liquid crystal display includes: a substrate; a gate line disposed on the substrate; a data line disposed on the substrate and crossing the gate line; a reference voltage line aligned with the data line; and a plurality of pixels arranged substantially in a matrix form on the substrate, where each of the pixels includes a first sub-pixel, a second sub-pixel, and a driving unit electrically connected to the gate line, the data line and the reference voltage line, and one reference voltage line is disposed between two adjacent pixel columns.

In an exemplary embodiment, the data line may be disposed between the two adjacent pixel columns and may be electrically connected to driving units of the pixels in the two adjacent pixel columns in a way such that the pixels are driven by a dot inversion method.

In an exemplary embodiment, the reference voltage line may include: a first portion disposed between one pixel column of the two adjacent pixel columns and the data line; a second portion opposite to the first portion with respect to an extension direction of the data line, and disposed between the other pixel column of the two adjacent pixel columns and the data line. In such an embodiment, the first portion and the second portion may be alternately disposed, with respect to the data line, along the extension direction of the data line, and the first portion and the second portion are electrically connected to each other across the data line.

In an exemplary embodiment, the first portion and the second portion may be repeatedly and alternately disposed on a pixel-by-pixel basis.

In an exemplary embodiment, the driving unit of a pixel may be electrically connected to a portion of the reference voltage line, which is located between the driving unit of the pixel and the data line.

In an exemplary embodiment, the liquid crystal display may further include a connecting unit which electrically connects the first portion and the second portion to each other.

In an exemplary embodiment, the connecting unit may include: a bridge crossing the data line; and an electrical contact unit which connects the bridge to the first and second portions.

In an exemplary embodiment, the bridge may include a material the same as a gate metal material of the gate line.

In an exemplary embodiment, the liquid crystal display may further include a first insulating layer disposed between the bridge, and the first and second portions of the reference voltage line and the data line; and a second insulating layer disposed on the first and second portions of the reference voltage line and the data line, where a contact hole is defined through the first insulating layer, the second insulating layer and the first or second portion of the reference voltage line. In such an embodiment, the electrical contact unit may be disposed in the contact hole, and connected to the bridge, and the first and second portions of the reference voltage line.

In an exemplary embodiment, the liquid crystal display may further include an insulating layer covering the bridge, where a contract hole is defined through the insulating layer to expose a portion of the bridge. In such an embodiment, the electrical contact unit may be defined by a portion of the first or second portion of the reference voltage line, where the portion of the first or second portion extends through the contact hole.

In an exemplary embodiment, the bridge may be disposed on the data line, and the first and second portions of the reference voltage line.

In an exemplary embodiment, the liquid crystal display may further include an insulating layer disposed on the first and second portions of the reference voltage line and the data line, where a contact hole is defined through the insulating layer to expose a portion of the first and second portions of the reference voltage line. In such an embodiment, the electrical contact unit is electrically connected to the first and second portions of the reference voltage line through the contact hole.

In an exemplary embodiment, the driving unit of a pixel may be connected to the data line at a side of the pixel, where the data line is located between a reference voltage line and the pixel, and connected to another reference voltage line at an opposing side of the pixel, where the other reference voltage line is located between the pixel and another data line.

In an exemplary embodiment, a connection of driving units of adjacent pixels in a pixel column and the data line, and a connection of the driving units of the adjacent pixels in the pixel column and the reference voltage line may be opposite to each other.

In an exemplary embodiment, the data line may be disposed between the two adjacent pixel columns, and the reference voltage line may be disposed in a zigzag manner with respect to the data line.

In an exemplary embodiment, the first sub-pixel and the second sub-pixel of a pixel may be arranged along the data line, and the driving unit of the pixel may be disposed between the first sub-pixel and the second sub-pixel.

In an exemplary embodiment, the driving unit may include: a first switching device connected to the gate line, the data line and the first sub-pixel; a second switching device connected to the gate line, the data line and the second sub-pixel; and a third switching device connected to the gate line, the reference voltage line and the first sub-pixel.

BRIEF DESCRIPTION OF THE DRAWINGS

These and/or other features of exemplary embodiments of the invention will become apparent and more readily appreciated from the following description of the exemplary embodiments, taken in conjunction with the accompanying drawings, in which:

FIG. 8 is an exemplary view of an arrangement of a data voltage applied to each pixel of a second-dimensional array of a pixel, when a liquid crystal display is driven by dot inversion.

DETAILED DESCRIPTION

Figure 1:
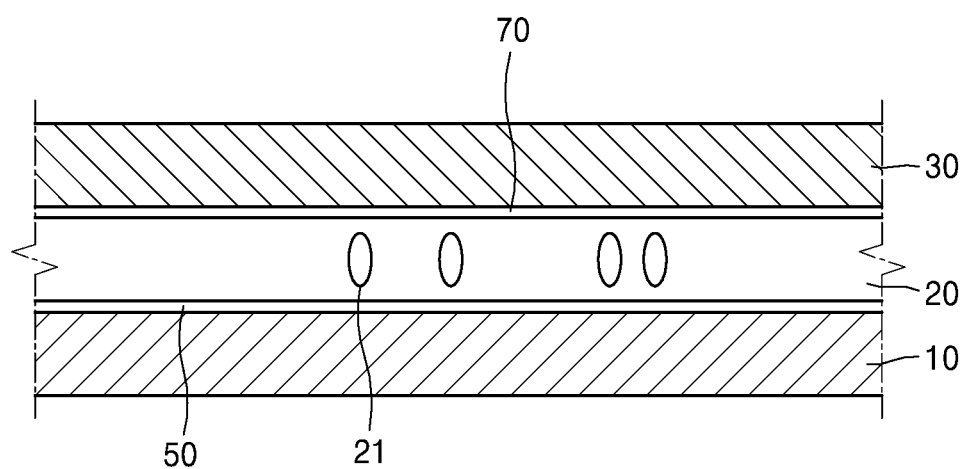
FIG. 1 is a schematic cross-sectional view of a liquid crystal display according to an exemplary embodiment.

Reference will now be made in detail to exemplary embodiments, examples of which are illustrated in the accompanying drawings, wherein like reference numerals refer to like elements throughout. In this regard, exemplary embodiments described herein may have different forms and should not be construed as being limited to the descriptions set forth herein. Accordingly, the exemplary embodiments are merely described below, by referring to the figures, to explain aspects of the present description. Expressions such as "at least one of," when preceding a list of elements, modify the entire list of elements and do not modify the individual elements of the list.

It will be understood that although the terms "first," "second," etc. may be used herein to describe various components, these components should not be limited by these terms. These components are only used to distinguish one component from another.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when a layer, region, or component is referred to as being "on," another layer, region, or component, it can be directly or indirectly on the other layer, region, or component. In contrast, when an element is referred to as being "directly on" another element, there are no intervening elements present.

Sizes of elements in the drawings may be exaggerated for convenience of explanation. In other words, since sizes and thicknesses of components in the drawings are arbitrarily illustrated for convenience of explanation, the following embodiments are not limited thereto.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims. In the drawings, thicknesses of layers and regions may be exaggerated for clarity of layers and regions.

When a certain embodiment may be implemented differently, a specific process order may be performed differently from the described order. For example, two consecutively described processes may be performed substantially at the same time or performed in an order opposite to the described order.

FIG. 1 is a schematic cross-sectional view of a liquid crystal display according to an exemplary embodiment.

Referring to FIG. 1, an exemplary embodiment of the liquid crystal display includes a first substrate and a second substrate, for example, a lower substrate 10 and an upper substrate 30, respectively, and a liquid crystal layer 20 disposed therebetween.

The lower substrate 10 and the upper substrate 30 may be transparent insulating substrates including glass or plastic, for example. An alignment layer may be disposed on inner surfaces of the lower substrate 10 and the upper substrate 30. The alignment layer may be, for example, a vertical alignment layer. Polarizers may be provided on outer surfaces of the lower substrate 10 and the upper substrate 30. In such an embodiment, transmittance axes of the two polarizers may be arranged to cross each other. In such an embodiment, the liquid crystal display may be a reflective type, and the polarizer may be disposed on a light exit surface, that is, only on the outer surface of the upper substrate 30.

In an exemplary embodiment, the liquid crystal layer 20 may be, for example, in a vertically aligned mode in which a major or longitudinal axis of liquid crystal molecules 21 is arranged to be perpendicular to the lower substrate 10 and the upper substrate 30, when an electric field is not applied thereto. In such an embodiment, at least one of a pixel electrode 50 and a common electrode 70 may be patterned. The liquid crystal molecules 21 of the liquid crystal layer 20 may have, for example, negative dielectric anisotropy. When two polarizers are arranged outside the lower substrate 10 and the upper substrate 30 to cross each other, light that has passed through one polarizer in a state when there is no electric field in the liquid crystal layer 20 is blocked without passing through the other polarizer (an analyzer). In an exemplary embodiment, the liquid crystal layer 20 may be in a horizontally aligned mode. In an exemplary embodiment, the electrode may not be patterned.

In one exemplary embodiment, for example, the pixel electrode 50 may be disposed on the lower substrate 10, and the common electrode 70 may be disposed on the upper substrate 30. Here, for convenience of explanation, an exemplary embodiment where the pixel electrode 50 is on the lower substrate 10 and the common electrode 70 is on the upper substrate 30 will be described. However, exemplary embodiments are not limited thereto. Here, the lower substrate 10 and the upper substrate 30 are comparative concepts and used for convenience of explanation, and it does not necessarily denote that the lower substrate 10 is located below and the upper substrate 30 is located above. From the point of a viewer, the lower substrate 10 may be located at a rear portion and the upper substrate 30 may be located at a front portion.

Figure 2:
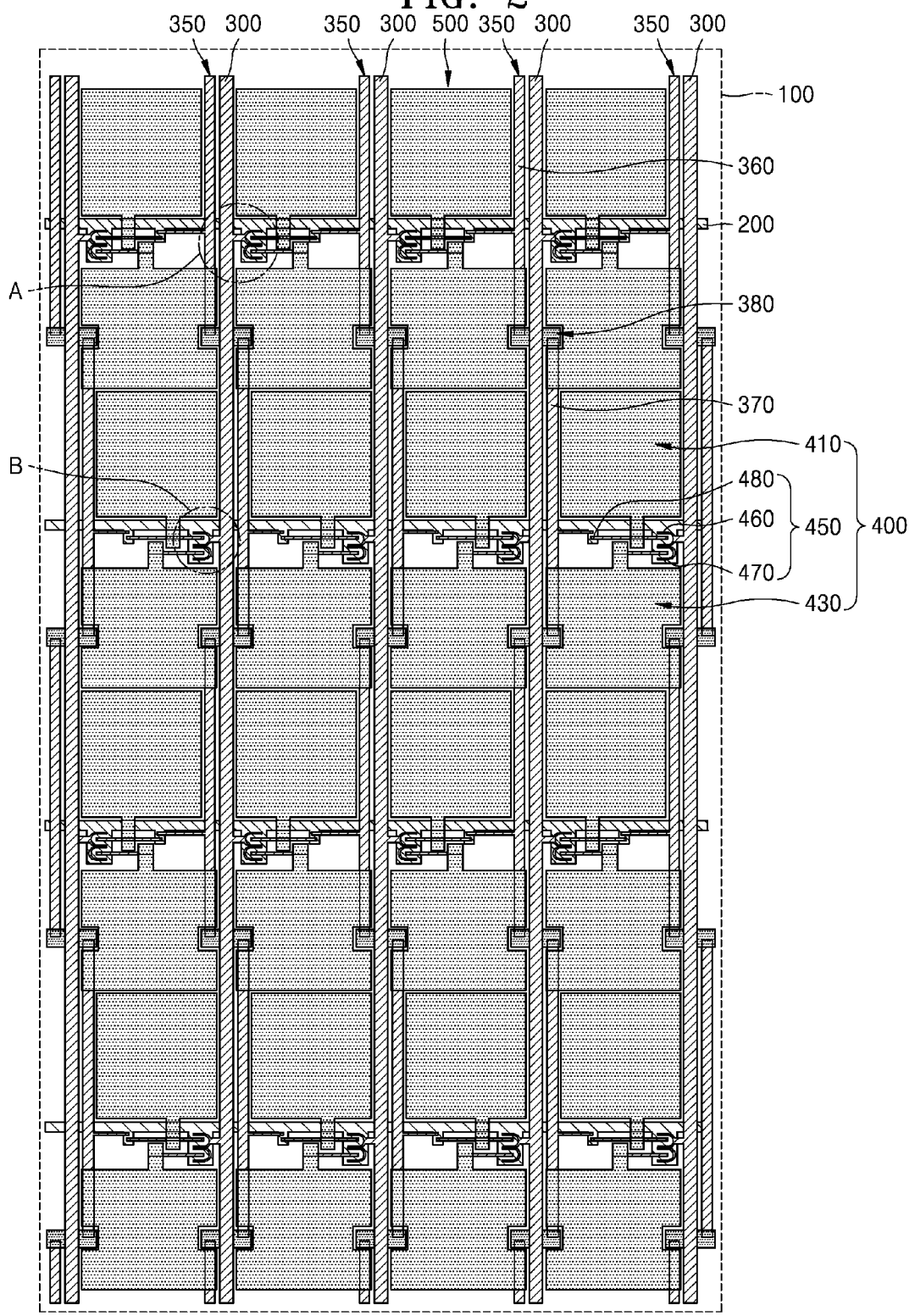
FIG. 2 is a plan view of a liquid crystal display according to an exemplary embodiment.
Figure 3:
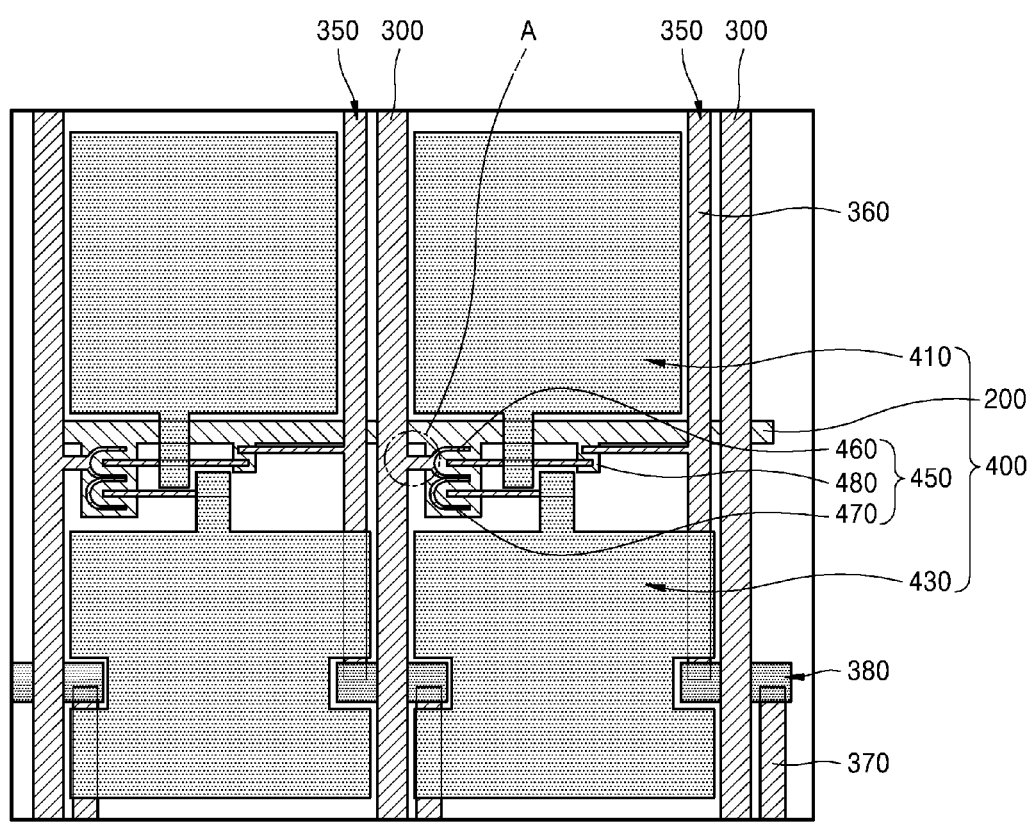
FIG. 3 is an enlarged view of a portion of FIG. 2.

FIG. 2 is a plan view of a liquid crystal display according to an exemplary embodiment. FIG. 2 illustrates a structure on a portion of a substrate 100, for example, a lower substrate, on which a driving unit 450 including a switching device of the liquid crystal display is disposed. FIG. 3 is an enlarged view of a portion of FIG. 2.

Referring to FIGS. 2 and 3, in an exemplary embodiment, the liquid crystal display may include a gate line 200 and a data line 300 disposed on the substrate 100, for example, the lower substrate, a reference voltage line 350 aligned with the data line 300, and a plurality of pixels 400 arranged substantially in a matrix form, e.g., a two-dimensional array of pixels 400. In such an embodiment, the gate line 200 may extend in a pixel row direction, and the data line 300 may extend in a pixel column direction. Each pixel 400 may include a first sub-pixel 410, a second sub-pixel 430, and the driving unit 450 electrically connected to a corresponding gate line 200, a corresponding data line 300 and the reference voltage line 350, and a single or only one reference voltage line 350 may be disposed between two adjacent pixels 400.

On the substrate 100, the driving unit 450 including the switching device, a pixel electrode, the gate line 200, the data line 300 and the reference voltage line 350 are arranged. The substrate 100 may be a transparent insulating substrate including glass or plastic, for example. Here, the pixel electrode may be disposed in each of an area of the first sub-pixel 410 and an area of the second sub-pixel 430. Here, for convenience, the pixel electrode is not illustrated.

The gate line 200 transfers a gate signal. When each pixel 400 includes the first sub-pixel 410 and the second sub-pixel 430, and a pixel is driven in a way according to which a voltage of one of the first and second sub-pixels 410 and 430, for example, the first sub-pixel 410, is raised by applying a voltage thereto via the reference voltage line 350, the driving unit 450 includes at least three switching devices, for example, first, second and third switching devices 460, 470 and 480, and thus, the gate line 200 may include first, second and third gate electrodes for the first, second and third switching devices 460, 470 and 480. Here, when a pixel is driven in such a way, according to which the voltage of the first sub-pixel 410 is raised, the first sub-pixel 410 may be a high pixel and the second sub-pixel 430 may be a low pixel.

In such an embodiment of the liquid crystal display, the data line 300 may be provided in a line unit. In such an embodiment, one data line 300 may be disposed between two adjacent pixel columns 500 or one pixel column 500, which is arranged along the data line 300, may be located between two adjacent data lines 300. The pixels 400 may be arranged in each pixel column 500.

In an exemplary embodiment, to provide the data line 300 in a line unit, and to drive the pixels 400 by a dot inversion method, the driving units 450 of two adjacent pixels 400 in each pixel column 500 arranged along the data line 300 may be electrically connected to the data lines 300 located at opposite sides, respectively. In one exemplary embodiment, For example, in one pixel column 500, the data line 300 located at a side thereof (a left side in FIG. 2), and the driving unit 450 of a pixel 400 may be electrically connected to each other, and the driving unit 450 of a pixel 400 adjacent to the pixel 400 may be electrically connected to the data line 300 located at an opposing side of the pixel column 500 (a right side in FIG. 2). In FIG. 2, A and B show points in which the driving units 450 of the two pixels adjacent to each other in the pixel column 500 are electrically connected to the data lines 300 located at sides opposite to each other, respectively.

Accordingly, when different data voltages, for example, a positive data voltage and a negative data voltage, are alternately applied to the adjacent data lines 300, the positive data voltage is applied to one pixel, and the negative data voltage is applied to an adjacent pixel adjacent to the one pixel in the same pixel column, and the negative data voltage is applied to a pixel which is located in a next pixel column to be adjacent to the one pixel, and the positive data voltage is applied to a pixel which is located in the next pixel column to be adjacent to the adjacent pixel. FIG. 8 illustrates an arrangement of the data voltage applied to each pixel 400 of the two-dimensional column of pixels 400, when the liquid crystal display according to exemplary embodiments is driven by a dot inversion method. In FIG. 8, "+" indicates a positive data voltage and "−" indicates a negative data voltage. Here, the negative data voltage may denote a relatively low data voltage compared to the positive data voltage, and the negative data voltage and the positive data voltage may not denote that the two have opposite polarities.

When, as described above, the data line 300 is electrically connected to the driving unit 450 of the pixel 400 in a jumping structure in which the data line 300 is connected to the pixels 400 by skipping one pixel for each pixel column 500, and each data line 300 located between two adjacent pixel columns 500 is electrically connected to the pixels 400 of a different pixel column 500 in different directions between adjacent pixels 400, the data line 300 may be provided in a line unit and the pixels 400 of the two-dimensional array may be driven by the dot inversion method, as illustrated in FIG. 8.

Referring back to FIGS. 2 and 3, the reference voltage line 350 may include a first portion 360 located between the pixel column 500 and the data line 300, and a second portion 370 staggered from the first portion 360 at a side opposite to the first portion 360, along an extension direction of the data line 300, and located between another adjacent pixel column 500 and the data line 300. The first portion 360 and the second portion 370 are alternately disposed opposite to each other at both sides of the data line 300 along the extension direction of the data line 300, and the first portion 360 and the second portion 370 may be electrically connected to each other across the data line 300. As described above, the data line 300 may be provided in a line unit and the reference voltage line 350 may be arranged in a zigzag manner with respect to the data line 300, along the data line 300.

In one exemplary embodiment, for example, the reference voltage line 350 may have a structure in which the first portion 360 thereof is located between one pixel column 500 and the data line 300, the second portion 370 thereof is located between another adjacent pixel column 500 and the data line 300, the first portion 360 and the second portion 370 are connected in a zigzag manner, thereby being aligned with the data line 300 overall, and one reference voltage line 350 may be located between two adjacent pixels 400. Accordingly, in such an embodiment, only a single or only one reference voltage line is disposed between two adjacent pixels such that an area of the pixel may be increased compared to a conventional liquid crystal display where two reference voltages lines are provided between two adjacent pixels.

Here, the first portion 360 and the second portion 370 of the reference voltage line 350 may be disposed in a way such that the first portion 360 and the second portion 370 are repeatedly and alternately disposed with respect to the data line 300, on a pixel-by-pixel basis.

In an exemplary embodiment, when the pixel 400 includes the first and second sub-pixels 410 and 430, for example, the first and second sub-pixels 410 and 430 may be arranged along the data line 300, and the driving unit 450 may be disposed in one pixel 400 between the first and second sub-pixels 410 and 430. Here, the location where the driving unit 450 is arranged is not limited to between the first and second sub-pixels 410 and 430, and may be variously modified. Although, an exemplary embodiment where the first and second sub-pixels 410 and 430 are arranged along the data line 300 is shown in FIGS. 2 and 3, the arrangement of the first and second sub-pixels 410 and 430 is not limited thereto, and may be variously modified.

In an exemplary embodiment, where the pixel 400 includes the first and second sub-pixels 410 and 430, the driving unit 450 may include the first, second and third switching devices 460, 470 and 480. The first switching device 460 may be connected to the gate line 200, the data line 300 and the first sub-pixel 410. The second switching device 470 may be connected to the gate line 200, the data line 300 and the second sub-pixel 430. The third switching device 480 may be connected to the gate line 200, the reference voltage line 350 and the first sub-pixel 410. When, as described above, the third switching device 480, connected to the reference voltage line 350, is connected to the first sub-pixel 410, the first sub-pixel 410 may be a high pixel, and a voltage applied to the first sub-pixel 410 may be boosted via a reference voltage applied via the reference voltage line 350.

In an exemplary embodiment of the liquid crystal display as described above, the driving unit 450 of a pixel 400 may be connected to the data line 300 located between the reference voltage line 350 and the pixel 400, and connected to another reference voltage line 350 at an opposite side, which is located between the pixel 400 and another data line 300. In such an embodiment, in the pixel column 500 along the data line 300, connections between the driving unit 450 of adjacent pixels 400 and the data line 300, and connections between the driving unit 450 of the adjacent pixels 400 and the reference voltage line 350 may be alternately in opposite directions. In one exemplary embodiment, for example, the driving unit 450 of a pixel 400 in a pixel column 500 may be connected to a data line 300 on the left side thereof and the first portion of the reference voltage line 350 disposed on the right side thereof, and the driving unit 450 of a next pixel 400 in the pixel column 500 may be connected to the data line 300 disposed on the right side thereof and a second portion 370 of the reference voltage line 350 on the left side, as shown in FIG. 2.

In an exemplary embodiment, the electrical connection between the driving unit 450 and the reference voltage line 350 may be defined or formed at a portion of the reference voltage line 350, which is located between the driving unit 450 of the pixel 400 and the data line 300. In one exemplary embodiment, for example, the first portion 360 of the reference voltage line 350, which is located between a first driving unit 450 of a predetermined pixel 400 located in a $M^{th}$ row of an $N^{th}$ pixel column 500, and an $N^{th}$ data line 300, may be electrically connected to the first driving unit 450, and the second portion 370 of the reference voltage line 350, which is located between a second driving unit 450 of a pixel 400 located in an $M+1^{th}$ row of an $N+1^{th}$ pixel column 500, and the $N^{th}$ data line 300, may be electrically connected to the second driving unit 450. Here, M and N are natural numbers.

According to an exemplary embodiment, the liquid crystal display may further include a connecting unit 380 that electrically connects the first portion 360 and the second portion 370 of the reference voltage line 350 to each other. The connecting unit 380 may have various connecting structures. Hereinafter, the connecting unit 380 of an exemplary embodiment of the liquid crystal display will be described in detail.

Figure 4A:
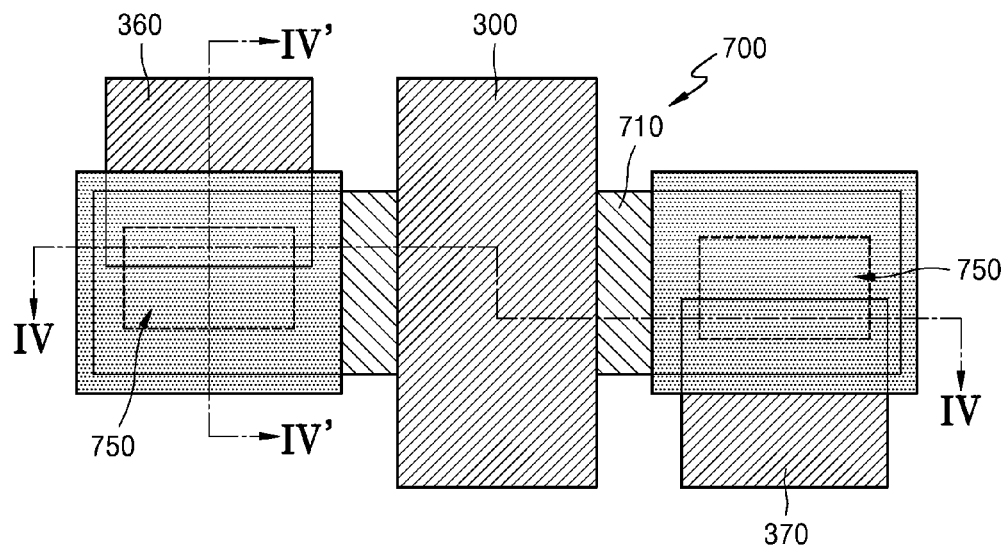
FIG. 4A is a view of a connecting unit configured to connect a first portion and a second portion of a reference voltage line, according to an exemplary embodiment.
Figure 4B:
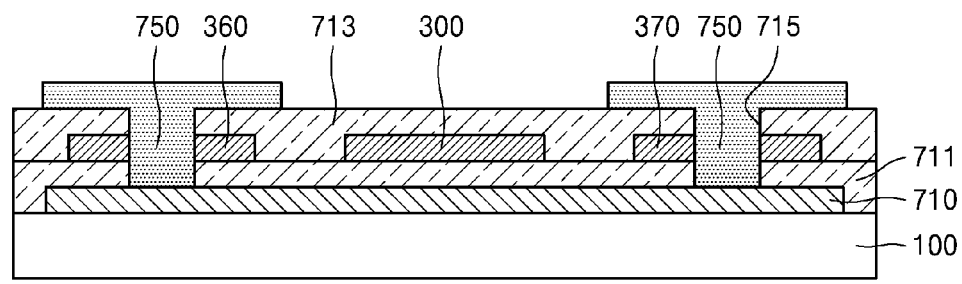
FIG. 4B is a cross-sectional view taken along line IV-IV of the connecting unit of FIG. 4A.
Figure 4C:
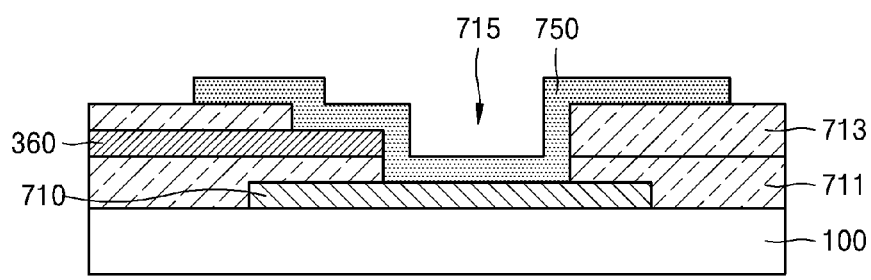
FIG. 4C is a cross-sectional view taken along line IV'-IV' of the connecting unit of FIG. 4A.

FIGS. 4A through 4C illustrate a connecting unit 700 that connects the first portion 360 and the second portion 370 of the reference voltage line 350, according to an exemplary embodiment. FIG. 4A is a plan view of the connecting unit 700, FIG. 4B is a cross-sectional view taken along line IV-IV of the connecting unit 700 of FIG. 4A, and FIG. 4C is a cross-sectional view taken along line IV'-IV' of the connecting unit 700 of FIG. 4A.

Referring to FIGS. 4A through 4C, in an exemplary embodiment, the connecting unit 700 may include a bridge 710 disposed on the substrate 100 to cross the data line 300 and an electrical contact unit 750 that connects the bridge 710 to the first and second portions 360 and 370.

The bridge 710 may include or be formed of, for example, a gate metal material simultaneously with the gate line 200. In an exemplary embodiment, where the bridge 710 is provided or formed simultaneously with the gate line 200, a first insulating layer 711 may be provided or formed between the first and second portions 360 and 370 of the reference voltage line 350, the data line 300 and the bridge 710, and a second insulating layer 713 may be provided or formed on the first and second portions 360 and 370 of the reference voltage line 350 and the data line 300. In such an embodiment, the electrical contact unit 750 may be provided or formed by filling a contact hole 715, with is defined through the bridge 710, the second insulating layer 713 and the first or second portion 360 or 370 of the reference voltage line 350 to expose the bridge 710, with a conductive material. In FIG. 4A, the first insulating layer 711 and the second insulating layer 713 are not illustrated, for convenience.

FIGS. 5A through 5E are views schematically illustrating an exemplary embodiment of a method of manufacturing the connecting unit 700 of FIGS. 4A through 4C.

Figure 5A:
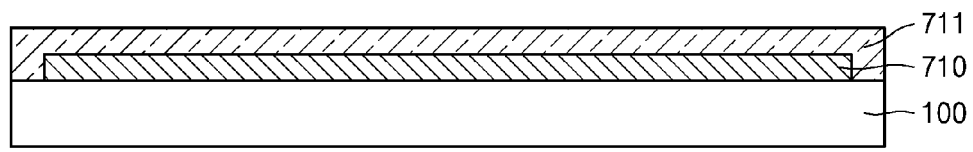
FIGS. 5A through 5E are views schematically illustrating an exemplary embodiment of a method of manufacturing the connecting unit of FIGS. 4A through 4C.

In such an embodiment, as illustrated in FIG. 5A, the bridge 710 and the first insulating layer 711 are provided or formed on the substrate 100.

Figure 5B:
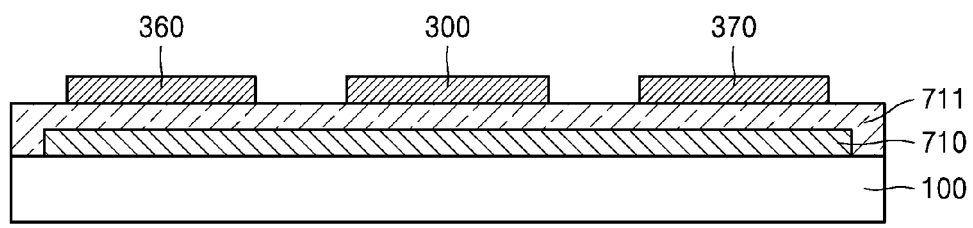
Figure 5C:
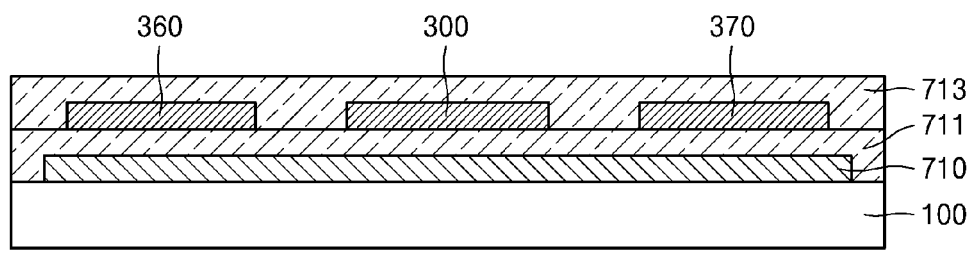

Next, as illustrated in FIGS. 5B and 5C, the data line 300, and the first and second portions 360 and 370 of the reference voltage line 350 are provided or formed on the first insulating layer 711, and the second insulating layer 713 is provided or formed on the first insulating layer 711 to cover the data line 300, and the first and second portions 360 and 370.

Figure 5D:
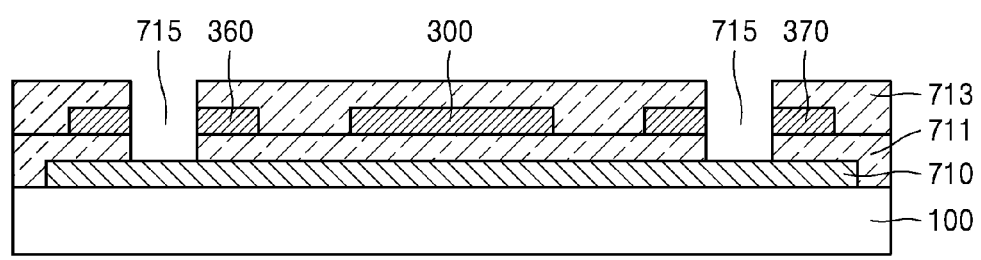
Figure 5E:
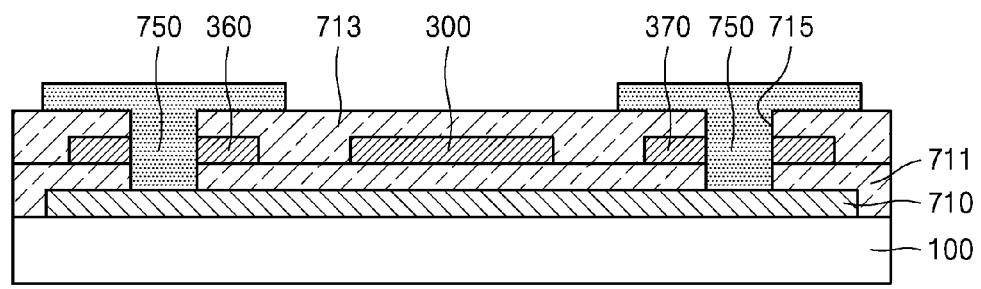

Next, as illustrated in FIG. 5D, the contact holes 715 are formed throughout the first and second insulating layers 711 and 713 to expose a portion of the bridge 710 which has to be electrically connected to the first and second portions 360 and 370. When the contact holes 715 are filled with a conductive material, for example, an IZO material, the contact unit 750 electrically connecting the bridge 710 and the first portion 360 of the reference voltage line 350 and electrically connecting the bridge 710 and the second portion 370 of the reference voltage line 350 is provided or formed, as illustrated in FIG. 5E.

Figure 6A:
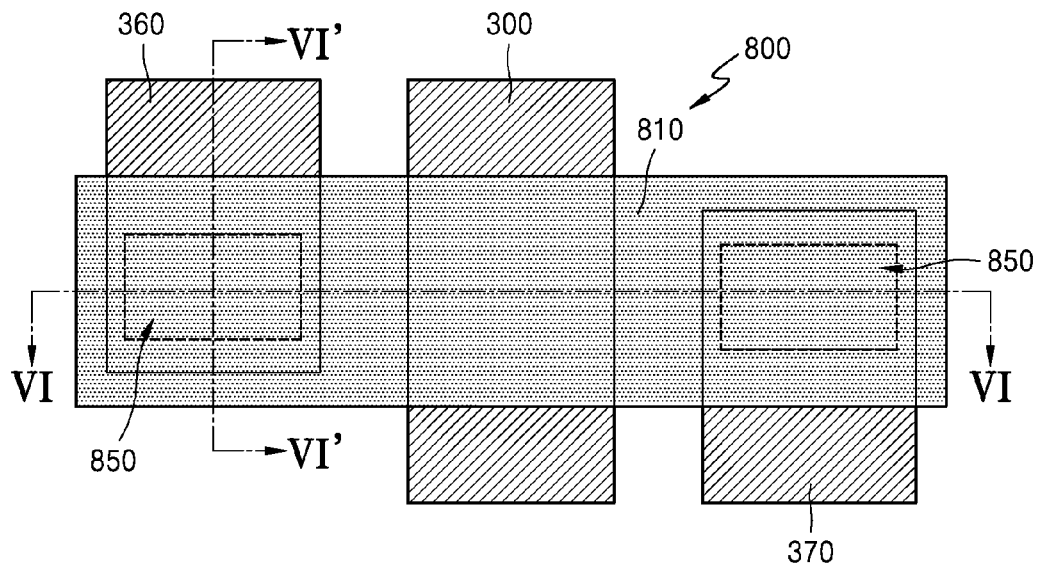
FIG. 6A is a view of a connecting unit configured to connect a first portion and a second portion of a reference voltage line, according to an alternative exemplary embodiment.
Figure 6B:
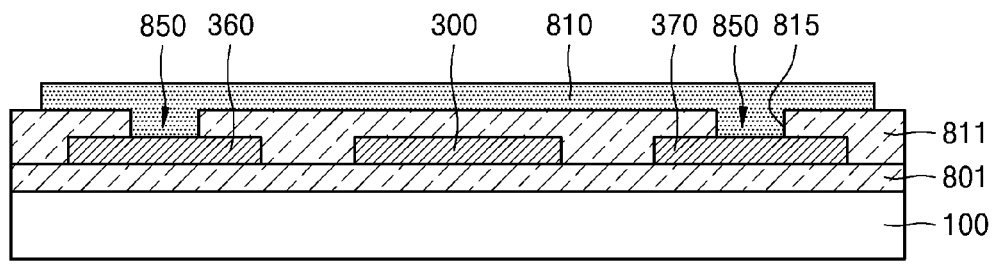
FIG. 6B is a cross-sectional view taken along line VI-VI of the connecting unit of FIG. 6A.
Figure 6C:
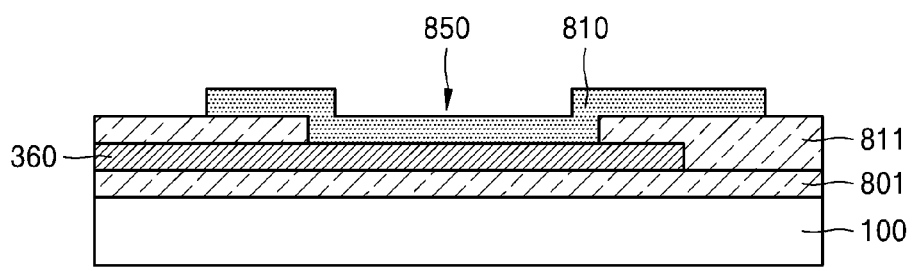
FIG. 6C is a cross-sectional view taken along line VI'-VI' of the connecting unit of FIG. 6A.

FIGS. 6A through 6C are views of a connecting unit 800 configured to connect the first and second portions 360 and 370 of the reference voltage line 350, according to an alternative exemplary embodiment. FIG. 6A is a plan view of the connecting unit 800, FIG. 6B is a cross-sectional view taken along line VI-VI of the connecting unit 800 of FIG. 6A, and FIG. 6C is a cross-sectional view taken along line VI'-VI' of the connecting unit 800 of FIG. 6A.

Referring to FIGS. 6A through 6C, the connecting unit 800 may include a bridge 810 crossing the data line 300, and an electrical contact unit 850 that connects the bridge 810 to the first and second portions 360 and 370.

In an exemplary embodiment, the bridge 810 may be provided or formed after providing the data line 300, and the first and second portions 360 and 370 of the reference voltage line 350 are provided or formed. In such an embodiment, as illustrated in FIGS. 6B and 6C, the first and second portions 360 and 370 of the reference voltage line 350, and the data line 300 may be firstly provided or formed on the substrate 100, and then, an insulating layer 811 may be provided or formed on the first and second portions 360 and 370 of the reference voltage line 350, and the data line 300. A contact hole 815 may be formed in the insulting layer 811, and the bridge 810 and the electrical contact unit 850 may be provided or formed on the insulating layer 811 by using a conductive material. The conductive material may be, for example, an indium zinc oxide ("IZO") material. Here, the bridge 810 and the electrical contact unit 850 may include or be formed of the same conductive material as each other, and alternatively, bridge 810 and the electrical contact unit 850 may include or be formed of different conductive materials from each other.

Here, FIGS. 6B and 6C illustrate an exemplary embodiment, where an insulating layer 801 is provided on the substrate 100, and the first and second portions 360 and 370 of the reference voltage line 350, and the data line 300 are provided on the insulating layer 801, but not being limited thereto. Alternatively, the insulating layer 801 may be omitted.

Figure 7A:
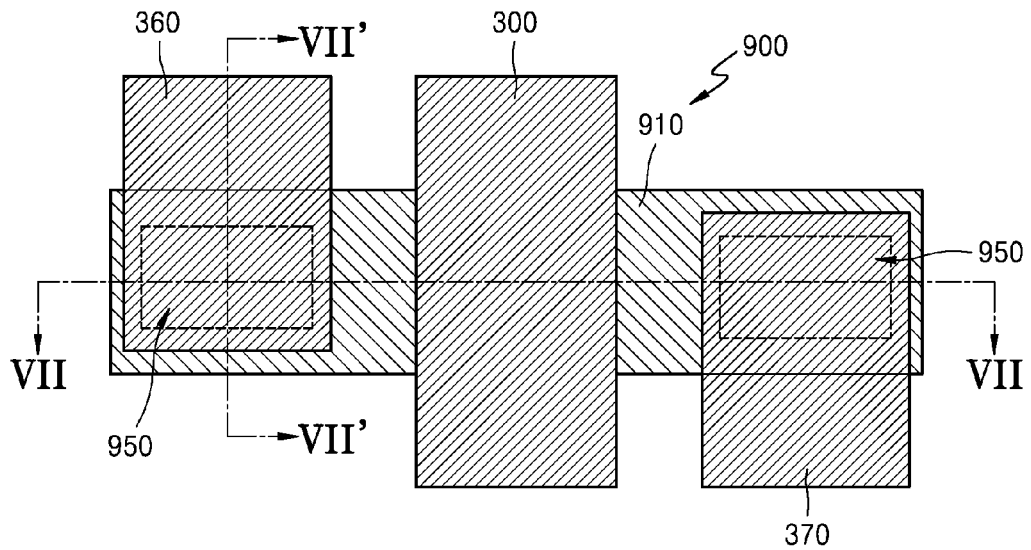
FIG. 7A is a view of a connecting unit configured to connect a first portion and a second portion of a reference voltage line, according to another alternative exemplary embodiment.
Figure 7B:
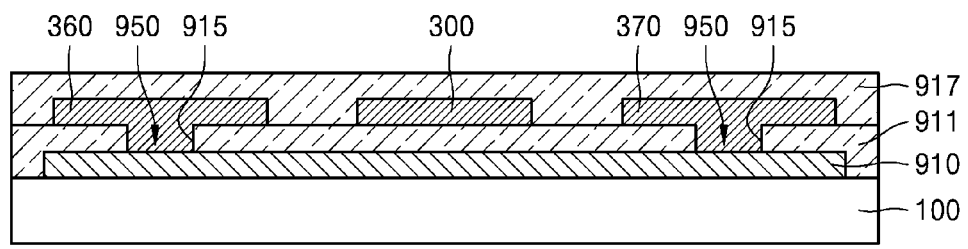
FIG. 7B is a cross-sectional view taken along line VII-VII of the connecting unit of FIG. 7A.
Figure 7C:
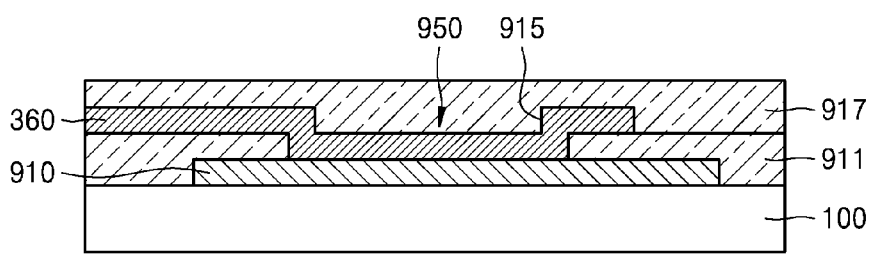
FIG. 7C is a cross-sectional view taken along line VII'-VII' of the connecting unit of FIG. 7A.

FIGS. 7A through 7C are views of a connecting unit 900 that connects the first portion 360 and the second portion 370 of the reference voltage line 350, according to another alternative exemplary embodiment. FIG. 7A is a plan view of the connecting unit 900, FIG. 7B is a cross-sectional view taken along line VII-VII of the connecting unit 900 of FIG. 7A, and FIG. 7C is a cross-sectional view taken along line VII'-VII' of the connecting unit 900 of FIG. 7A.

Referring to FIGS. 7A through 7C, in an exemplary embodiment, the connecting unit 900 may include a bridge 910 crossing the data line 300, and an electrical contact unit 950 that connects the bridge 910 to the first and second portions 360 and 370.

In an exemplary embodiment, the bridge 910 may include or be formed of, for example, the same material as a gate metal material, in which the bridge 910 may be simultaneously provided with the gate line 200. When the bridge 910 is provided or formed simultaneously with the gate line 200, an insulating layer 911 covering the bridge 910 may further be provided, as illustrated in FIGS. 7B and 7C. The electrical contact unit 950 may be provided or formed simultaneously with the first and second portions 360 and 370 of the reference voltage line 350, via the contact hole 915 formed in the insulating layer 911 to expose the bridge 910. An insulating layer 917 covering the electrical contact unit 950 may further be provided or formed.

As described above, according to exemplary embodiments set forth herein, the liquid crystal display includes the first and second sub-pixels in each pixel, and a reference voltage is applied to the sub-pixel, to which a relatively high voltage is applied, for example, the first sub-pixel, via the reference voltage line arranged along the data line, and thus, a voltage of the first sub-pixel may be boosted. Accordingly, a side visibility may become substantially close to a front visibility and a gray-scale may be substantially accurately represented in a low gray scale area, while a brightness decrease compared to an applied pixel driving voltage is effectively prevented.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A liquid crystal display comprising:
    a substrate;
    a gate line disposed on the substrate;
    a data line disposed on the substrate and crossing the gate line;
    a reference voltage line aligned with the data line; and
    a plurality of pixels arranged substantially in a matrix form on the substrate,
    wherein each of the pixels comprises:
    a first sub-pixel:
    a second sub-pixel: and
    a driving unit electrically connected to the gate line, the data line and the reference voltage line, and
    wherein one reference voltage line is disposed between two adjacent pixel columns,
    wherein
    the driving unit of a pixel is connected to the data line at a side of the pixel, wherein the data line is disposed between the reference voltage line and the pixel,
    the driving unit of the pixel is connected to another reference voltage line at an opposing side of the pixel, wherein the another reference voltage line is disposed between the pixel and another data line, and
    a connection of driving units of adjacent pixels in a pixel column and the data line, and a connection of the driving units of the adjacent pixels in the pixel column and the reference voltage line are opposite to each other.

2. The liquid crystal display of claim 1, wherein
    the data line is disposed between the two adjacent pixel columns, and
    the data line is electrically connected to driving units of the pixels in the two adjacent pixel columns in a way such that the pixels are driven by a dot inversion method.

3. The liquid crystal display of claim 2, wherein the reference voltage line comprises:
    a first portion disposed between one pixel column of the two adjacent pixel columns and the data line; and
    a second portion opposite to the first portion with respect to an extension direction of the data line, and disposed between the other pixel column of the two adjacent pixel columns and the data line,
    wherein the first portion and the second portion are alternately disposed, with respect to the data line, along the extension direction of the data line, and
    the first portion and the second portion are electrically connected to each other across the data line.

4. The liquid crystal display of claim 3, wherein the first portion and the second portion are repeatedly and alternately disposed on a pixel-by-pixel basis.

5. The liquid crystal display of claim 3, wherein the driving unit of a pixel is electrically connected to a portion of the reference voltage line, which is located between the driving unit of the pixel and the data line.

6. The liquid crystal display of claim 3, further comprising:
    a connecting unit which electrically connects the first portion and the second portion to each other.

7. The liquid crystal display of claim 6, wherein the connecting unit comprises:
    a bridge crossing the data line; and
    an electrical contact unit which connects the bridge to the first and second portions of the reference voltage line.

8. The liquid crystal display of claim 7, wherein the bridge comprises a material the same as a gate metal material of the gate line.

9. The liquid crystal display of claim 8, further comprising:
    a first insulating layer disposed between the bridge, and the first and second portions of the reference voltage line and the data line; and
    a second insulating layer disposed on the first and second portions of the reference voltage line and the data line, wherein a contact hole is defined through the first insulating layer, the second insulating layer and the first or second portion of the reference voltage line,
    wherein the electrical contact unit is disposed in the contact hole, and connected to the bridge, and the first and second portions of the reference voltage line.

10. The liquid crystal display of claim 8, further comprising:
    an insulating layer covering the bridge, wherein a contract hole is defined through the insulating layer to expose a portion of the bridge,
    wherein the electrical contact unit is defined by a portion of the first or second portion of the reference voltage line, wherein the portion of the first or second portion extends through the contact hole.

11. The liquid crystal display of claim 7, wherein the bridge is disposed on the data line, and the first and second portions of the reference voltage line.

12. The liquid crystal display of claim 11, further comprising:
    an insulating layer disposed on the first and second portions of the reference voltage line and the data line, wherein a contact hole is defined through the insulating layer to expose a portion of the first and second portions of the reference voltage line,
    wherein the electrical contact unit is electrically connected to the first and second portions of the reference voltage line through the contact hole.

13. The liquid crystal display of claim 1, wherein
    the data line is disposed between the two adjacent pixel columns, and
    the reference voltage line is disposed in a zigzag manner with respect to the data line.

14. The liquid crystal display of claim 1, wherein
    the first sub-pixel and the second sub-pixel of a pixel are arranged along the data line, and
    the driving unit of the pixel is disposed between the first sub-pixel and the second sub-pixel.

15. The liquid crystal display of claim 1, wherein the driving unit comprises:

a first switching device connected to the gate line, the data line and the first sub-pixel;

a second switching device connected to the gate line, the data line and the second sub-pixel; and a third switching device connected to the gate line, the reference voltage line and the first sub-pixel.

16. A liquid crystal display comprising:

a substrate;

a gate line disposed on the substrate;

a data line disposed on the substrate and crossing the gate line;

a reference voltage line aligned with the data line; and
a plurality of pixels arranged substantially in a matrix form on the substrate, wherein each of the pixels comprises:

a first sub-pixel:

a second sub-pixel: and a driving unit electrically connected to the gate line, the data line and the reference voltage line, wherein only a single reference voltage line is disposed between two adjacent pixel columns, and wherein the driving unit of a pixel is connected to the data line at a side of the pixel, wherein the data line is disposed between the reference voltage line and the pixel, the driving unit of the pixel is connected to another reference voltage line at an opposing side of the pixel, wherein the another reference voltage line is disposed between the pixel and another data line, and a connection of driving units of adjacent pixels in a pixel column and the data line, and a connection of the driving units of the adjacent pixels in the pixel column and the reference voltage line are opposite to each other.

17. The liquid crystal display of claim 16, wherein the data line is disposed between the two adjacent pixel columns, and the data line is electrically connected to driving units of the pixels in the two adjacent pixel columns in a way such that the pixels are driven by a dot inversion method.

18. The liquid crystal display of claim 17, wherein the reference voltage line comprises:

a first portion disposed between one pixel column of the two adjacent pixel columns and the data line; and a second portion opposite to the first portion with respect to an extension direction of the data line, and disposed between the other pixel column of the two adjacent pixel columns and the data line, wherein the first portion and the second portion are alternately disposed, with respect to the data line, along the extension direction of the data line, and the first portion and the second portion are electrically connected to each other across the data line.

* * * * *